(12) United States Patent
Wang et al.

(10) Patent No.: US 12,107,154 B2
(45) Date of Patent: *Oct. 1, 2024

(54) SINGLE FIN STRUCTURES

(71) Applicant: GlobalFoundries U.S. Inc., Malta, NY (US)

(72) Inventors: Haiting Wang, Clifton Park, NY (US); Hong Yu, Clifton Park, NY (US); Zhenyu Hu, Clifton Park, NY (US)

(73) Assignee: GlobalFoundries Inc., Malta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,489

(22) Filed: May 26, 2023

(65) Prior Publication Data

US 2023/0299181 A1 Sep. 21, 2023

Related U.S. Application Data (63) Continuation of application No. 17/398,479, filed on Aug. 10, 2021, now Pat. No. 11,705,508, and a continuation of application No. 16/688,267, filed on Nov. 19, 2019, now Pat. No. 11,127,842.

(51) Int. Cl.
| | |
|---|---|
| *H01L 29/66* | (2006.01) |
| *H01L 21/285* | (2006.01) |
| *H01L 21/762* | (2006.01) |
| *H01L 29/06* | (2006.01) |
| *H01L 29/417* | (2006.01) |
| *H01L 29/45* | (2006.01) |
| *H01L 29/78* | (2006.01) |

(52) U.S. Cl.
CPC .... *H01L 29/6681* (2013.01); *H01L 21/28518* (2013.01); *H01L 21/76224* (2013.01); *H01L 29/0653* (2013.01); *H01L 29/41791* (2013.01); *H01L 29/45* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 8,881,066 B2 | 11/2014 | Shieh et al. | |
| 8,987,836 B2 | 3/2015 | Kim et al. | |
| 9,236,267 B2 | 1/2016 | De et al. | |
| 11,127,842 B2* | 9/2021 | Wang | H01L 29/6681 |
| 11,705,508 B2* | 7/2023 | Wang | H01L 21/76232 |
| | | | 257/384 |
| 2014/0134824 A1 | 5/2014 | Chen et al. | |

(Continued)

*Primary Examiner* — Feifei Yeung Lopez
(74) *Attorney, Agent, or Firm* — Andrew M. Calderon; Calderon Safran & Wright P.C.

(57) ABSTRACT

The present disclosure generally relates to semiconductor structures and, more particularly, to single fin structures and methods of manufacture. The structure includes: an active single fin structure; a plurality of dummy fin structures on opposing sides of the active single fin structure; source and drain regions formed on the active single fin structure and the dummy fin structures; recessed shallow trench isolation (STI) regions between the dummy fin structures and the active single fin structure and below a surface of the dummy fin structures; and contacts formed on the source and drain regions of the active single fin structure with a spacing of at least two dummy fin structures on opposing sides of the contacts.

20 Claims, 8 Drawing Sheets

(56) References Cited

U.S. PATENT DOCUMENTS

| | | |
|---|---|---|
| 2015/0076569 A1 | 3/2015 | Hong et al. |
| 2015/0084129 A1 | 3/2015 | Lee et al. |
| 2015/0255543 A1 | 9/2015 | Cheng et al. |
| 2016/0133623 A1 | 5/2016 | Xie |
| 2018/0174953 A1 | 6/2018 | Nam et al. |
| 2018/0308746 A1* | 10/2018 | Hu .................... H01L 29/66795 |

* cited by examiner

SINGLE FIN STRUCTURES

FIELD OF THE INVENTION

The present disclosure generally relates to semiconductor structures and, more particularly, to single fin structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

Single fin structures are desirable for certain applications. However, single fin structures can suffer from crystal defects caused by stress from flowable chemical vapor deposition (FCVD) processes used to form shallow trench isolation (STI) structures. Specifically, stress from the FCVD process causes densification and shrinkage of the fin substrate during thermal annealing, thereby pulling apart the fin structure and causing leakage issues within the gate structures. Accordingly, these crystal defects can cause significant yield loss and malfunction for single fin structures.

SUMMARY

In an aspect of the disclosure, a structure comprises: an active single fin structure; a plurality of dummy fin structures on opposing sides of the active single fin structure; source and drain regions formed on the active single fin structure and the dummy fin structures; recessed shallow trench isolation (STI) regions between the dummy fin structures and the active single fin structure and below a surface of the dummy fin structures; and contacts formed on the source and drain regions of the active single fin structure with a spacing of at least two dummy fin structures on opposing sides of the contacts.

In an aspect of the disclosure, a structure comprises: a fin structure in an active region of a device; a plurality of fin structures in inactive regions of the device and on opposing sides of the fin structure in the active region; source and drain regions on the fin structures in both the active region and the inactive regions; recessed shallow trench isolation (STI) regions between fin structures in both the active region and the inactive regions; and contacts formed on the source and drain regions in the active region with a spacing of at least two fin structures.

In an aspect of the disclosure, a method comprises: forming an active single fin structure; forming a plurality of dummy fin structures on opposing sides of the active single fin structure; forming source and drain regions on the active single fin structure and the dummy fin structures; forming shallow trench isolation (STI) regions between the dummy fin structures and the active single fin structure and below a surface of the dummy fin structures; and forming contacts formed on the source and drain regions of the active single fin structure with a spacing of at least two dummy fin structures on opposing sides of the contacts.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to single fin structures and methods of manufacture. In embodiments, the processes and structures provided herein allow for dummy fins to be formed adjacent to an active single fin device, i.e., field effect transistor (finFET). Advantageously, by forming a plurality of dummy fins, degradation of a single active fin caused by stress from formation of shallow trench isolation (STI) regions is prevented, thereby improving yield and device performance for single fin structures. The processes and structures described herein allow for a single fin structure which is free of crystal defects, enabling low power consumption applications without leakage issues.

The processes described herein include dummy and active gate fin formation, e.g., self-aligned double patterned (SADP) or sidewall image transfer (SIT) fin formation, and a flowable chemical vapor deposition (FCVD) shallow trench fill. The fin structures which are not active, i.e., dummy fin structures, are maintained during the flowable process. Following the flowable process, a dummy gate structure can be formed over the dummy fin structures and the active fin structure. Source and drain regions are formed by an epitaxial growth, followed by formation of replacement gate structures. In this way, a plurality of fin structures with a one (1) fin pitch array can be formed, with dummy fin structures being maintained and source and drain contacts being patterned to land only on the single active fin structure. In embodiments, the structures and processes described herein can be applied to 14 nm technologies, or smaller.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC)

technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
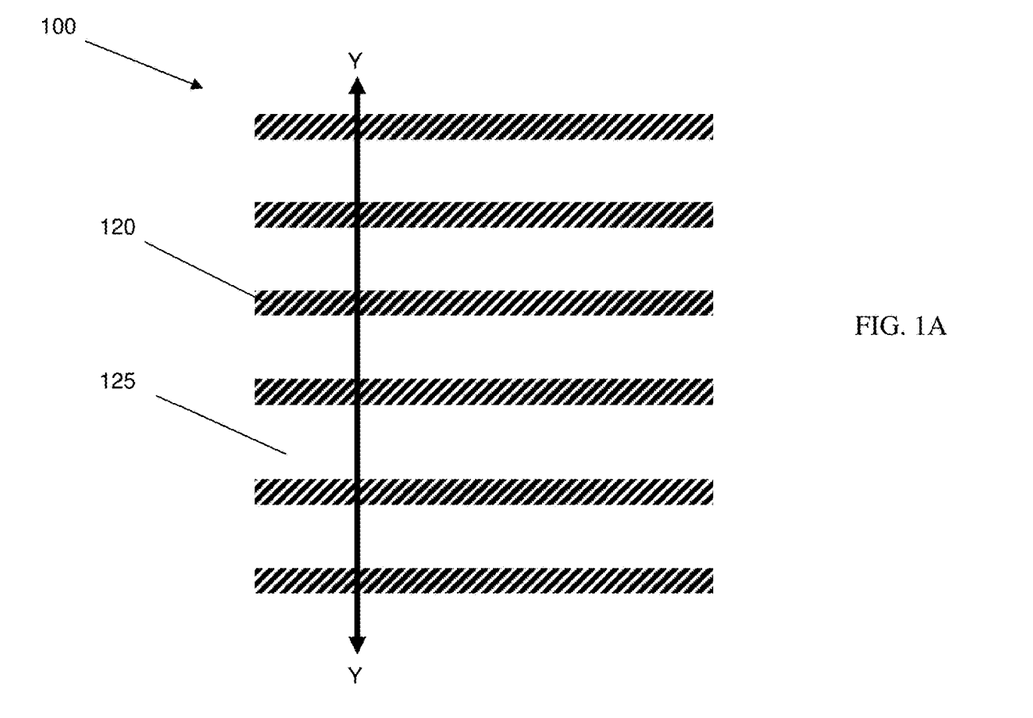
FIGS. 1A and 1B show fin structures, amongst other features, and respective fabrication processes in accordance with aspects of the present disclosure.
Figure 1B:
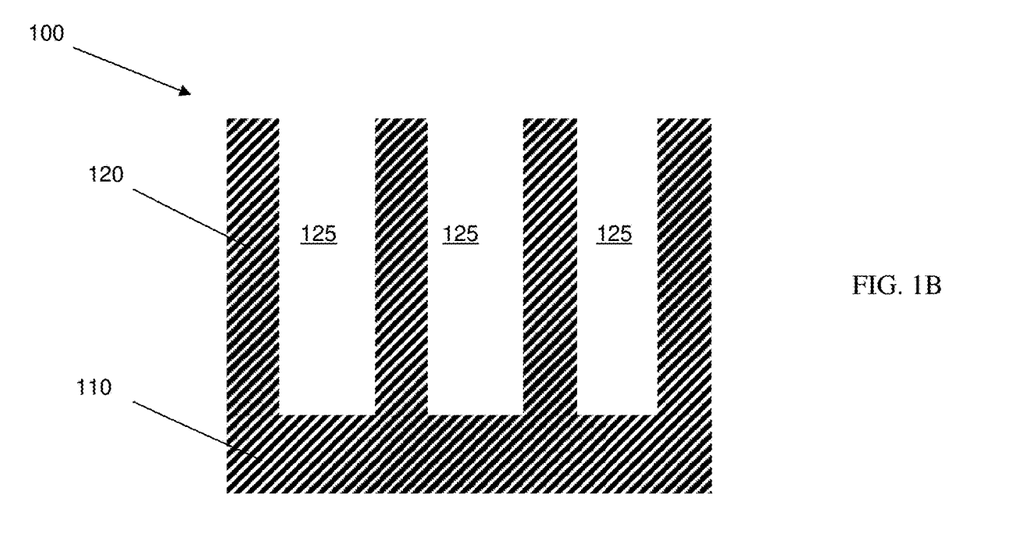

FIG. 1A depicts a top view of a structure 100; whereas, FIG. 1B depicts the structure 100 along a line Y-Y of FIG. 1A. Specifically, FIGS. 1A and 1B show an incoming structure 100 and respective fabrication processes in accordance with aspects of the present disclosure. In embodiments, the structure 100 includes fin structures 120 composed of a substrate 110, with trenches 125 between the fin structures 120. As an example, the substrate 110 may be composed of any suitable substrate material including, but not limited to, Si, SiGe, SiGeC, SiC, GaAs, InAs, InP, etc. In further embodiments, the substrate 110 is a bulk substrate or a silicon-on-insulator (SOI) substrate, for example.

In one illustrative example, the fin structures 120 can have a pitch of 48 nm. Further, active fin structures can be separated from dummy fin structures. The fin structures 120 can be fabricated using a self-aligned double patterned (SADP) technique or a sidewall image transfer (SIT) technique. In an example of a SIT technique, a mandrel material, e.g., $SiO_2$, is deposited on the substrate 110 using conventional chemical vapor deposition (CVD) processes. A resist is formed on the mandrel material and exposed to light to form a pattern (openings). A reactive ion etching is performed through the openings to form the mandrels. In embodiments, the mandrels can have different widths and/or spacing depending on the desired dimensions of the fin structures 120. The mandrels are then covered with a deposition layer, which is etched to form spacers on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features, e.g., fin structures 120. The sidewall spacers can then be stripped. In embodiments, the width of each fin structure can be different dimensions depending on the design parameters.

Figure 2A:
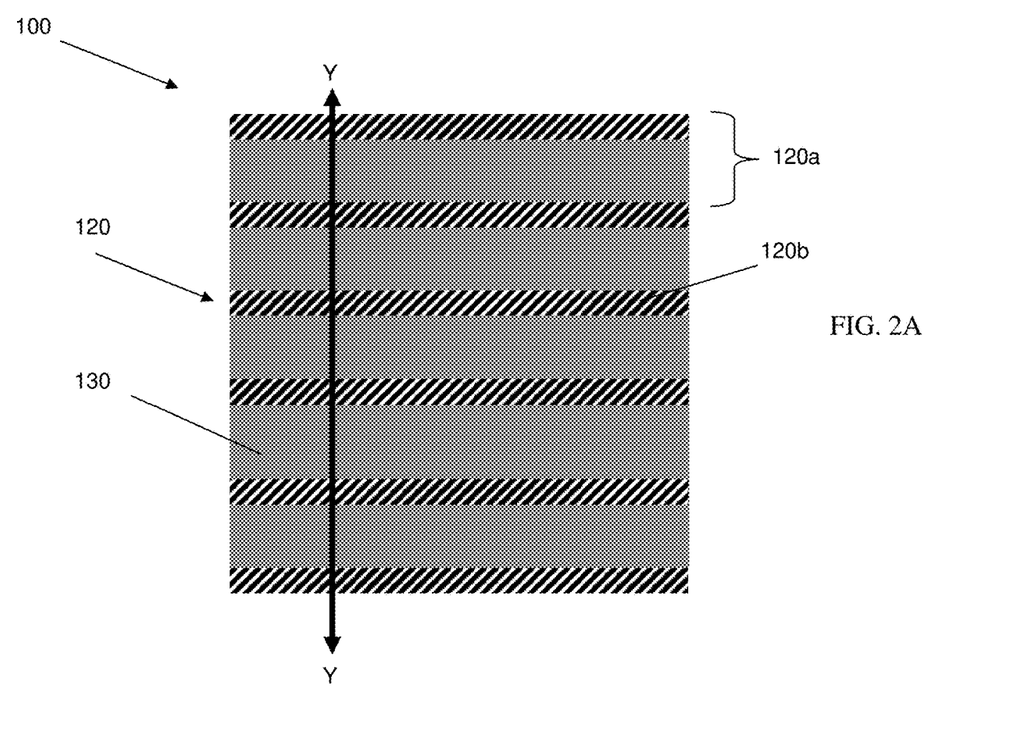
FIGS. 2A and 2B show an insulator material between the fin structures, amongst other features, and respective fabrication processes in accordance with aspects of the present disclosure.
Figure 2B:
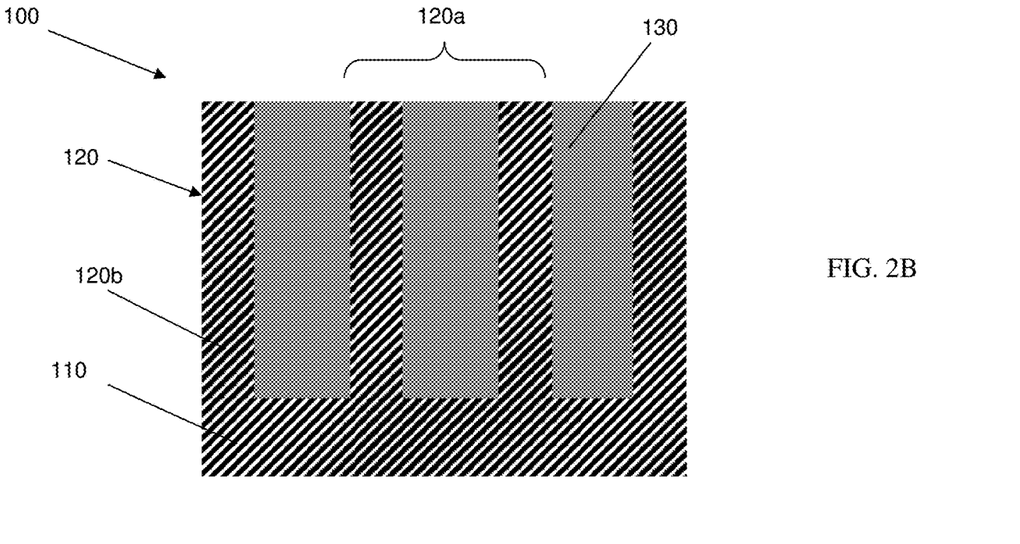

FIG. 2A depicts a top view of the structure 100 with insulator (e.g., oxide) material between the fin structures 120; whereas, FIG. 2B depicts the structure 100 along a line Y-Y of FIG. 2A. Specifically, FIGS. 2A and 2B show the deposition of an oxide material within the trenches 125 to form shallow trench isolation (STI) regions 130 between the fin structures 120, and specifically dummy fin structures 120a over a non-device region and a single active fin structure 120b over a device region. The oxide material of the STI regions 130 can be deposited by a flowable chemical vapor deposition (FCVD) process in the trenches 125, followed by a CMP process to a top surface of the fin structures 120 to remove any excess material. In embodiments, the fin structure in the active region, i.e., single active fin structure 120b, and the fin structures, i.e., dummy fin structures 120a, are composed of a same material, i.e., substrate 110.

The dummy fin structures 120a do not have any contacts or metallization features connected thereto, while the single active fin structure 120b is over an active region of the device and will have contacts and interconnection structures extending therefrom. In further embodiments, the dummy fin structures 120a are separated from one another by at least 40 nm. in this way, the processes described herein include dummy fin structures 120a which are formed to be separated from one another by at least 40 nm, and the spacing of the at least two dummy fin structures 120a is formed by having the contacts land only on the source and drain regions of the active single fin structure 120b. As illustrated in FIG. 2A, the dummy fin structures 120a sit beside the single active fin structure 120b. Specifically, the fin structure 120 in the active region is a single fin structure 120b surrounded by dummy fin structures 120a.

Figure 3:
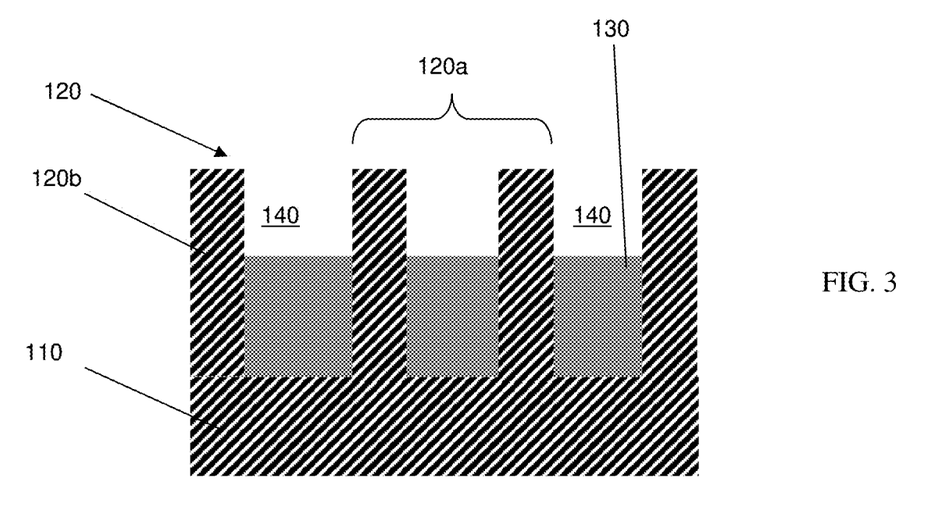
FIG. 3 shows a recessed insulator material between the fin structures, amongst other features, and respective fabrication processes in accordance with aspects of the present disclosure.

FIG. 3 shows a recess process to form STI regions 130 in accordance with aspects of the present disclosure. In embodiments, the oxide is recessed to form one or more recesses 140 between the fin structures 120, which also exposes upper sidewalls of the fin structures 120. To recess the oxide of the STI regions 130, a selective chemistry with a timed etching process will be used to form one or more recesses 140 of the oxide material of the STI regions 130. This will expose an upper portion of the fins 120. In embodiments, the recess process can be a maskless process. In this way, the STI regions 130 are recessed STI regions. Further, these recessed STI regions are composed of an oxide of a flowable chemical vapor deposition (FCVD).

In known processes, select fin structures (dummy fin structures 120a) of the fin structures 120 are removed to form a deep STI structure; however, in the present disclosure, the dummy fin structures 120a are not removed and, instead, the dummy fin structures 120a are maintained to provide support to the single active fin structure 120b. Accordingly, any stress on the substrate 110, and specifically the single active fin structure 120b, caused by FCVD processes is reduced by the dummy fin structures 120a. A reduction in the stress on the single active fin structure 120b prevents crystal defects in the substrate 110, which allows for a reduction in leakage issues, yield loss and malfunction. In further embodiments, the dummy fin structures 120a can be removed in later processing steps.

Figure 4A:
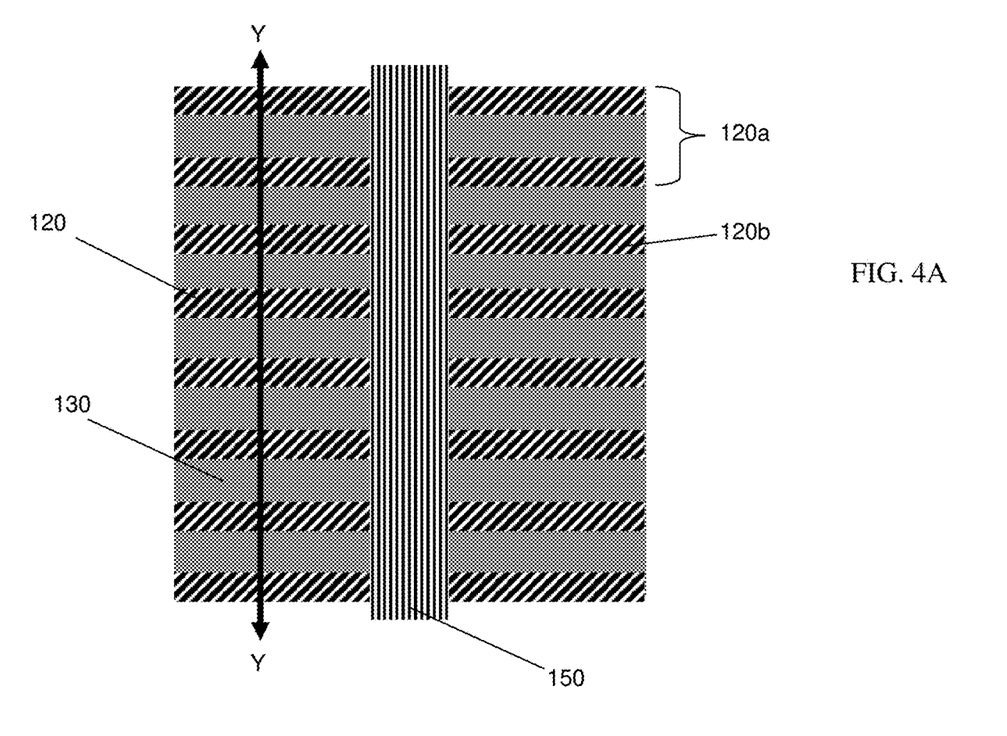
FIGS. 4A and 4B show a dummy gate structure, amongst other features, and respective fabrication processes in accordance with aspects of the present disclosure.
Figure 4B:
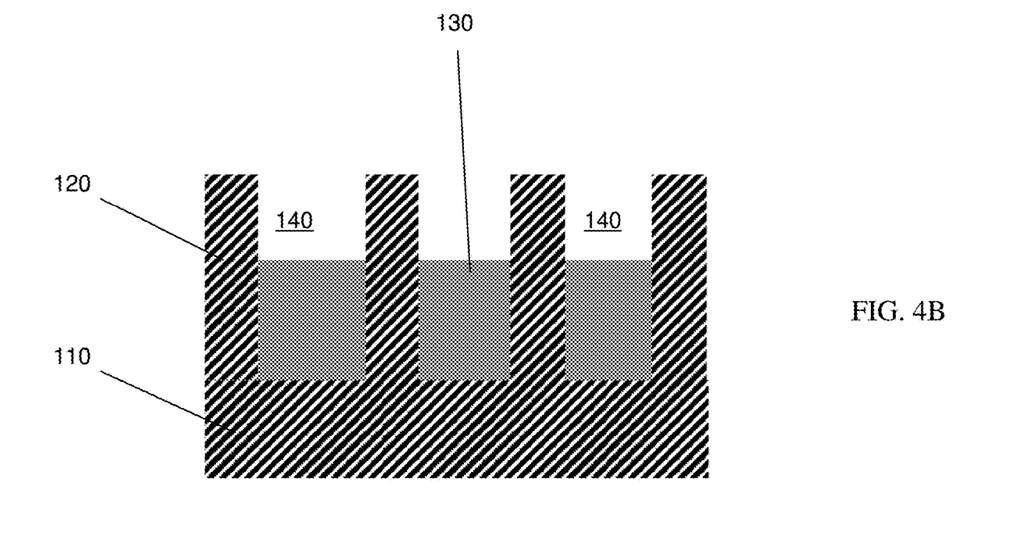

FIG. 4A depicts a top view of the structure 100 with a dummy gate structure; whereas, FIG. 4B depicts the structure 100 along a line Y-Y of FIG. 4A. Specifically, FIGS. 4A and 4B show a dummy gate structure 150 formed over the fin structures 120. In embodiments, the dummy gate structure 150 is composed of a poly silicon (poly-Si) material, and is deposited by conventional processes, e.g., chemical vapor deposition (CVD). In more specific embodiments, the dummy gate structure 150 includes a deposition of a poly material, followed by a patterning process. Sidewall spacers can be formed on the sidewalls of the patterned poly material using conventional deposition and anisotropic etching methods known to those of skill in the art such that no further explanation is required for a complete understanding of the disclosure. In embodiments, a dielectric material can be deposited under the poly material. The dielectric material can be a high-k dielectric material as described herein.

Figure 5A:
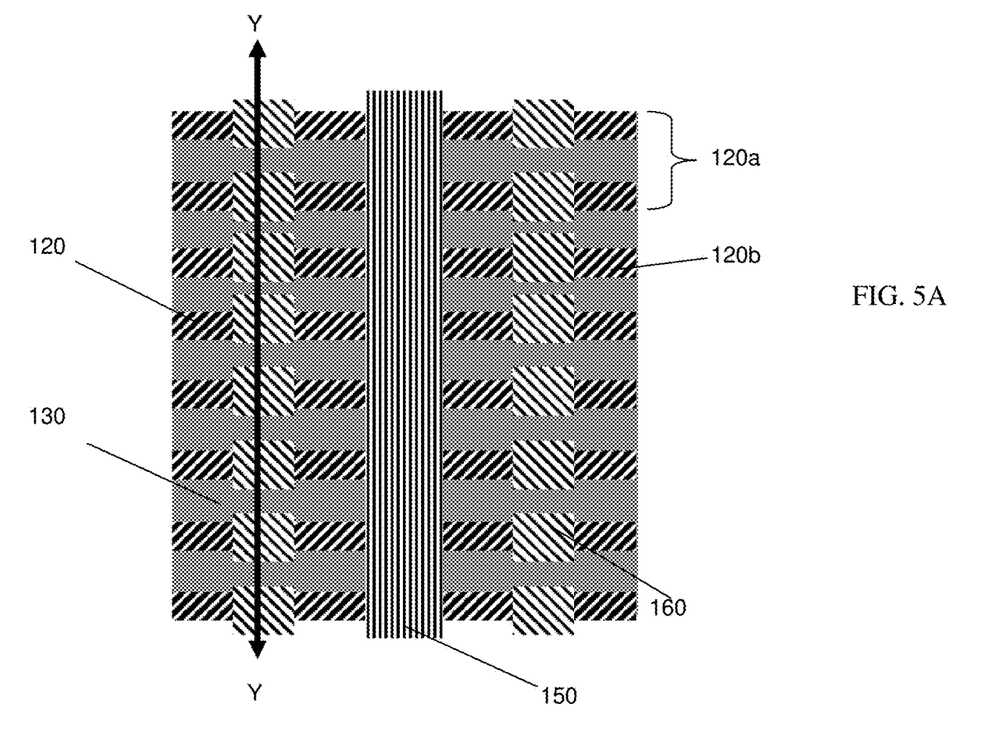
FIGS. 5A and 5B show source and drain regions, amongst other features, and respective fabrication processes in accordance with aspects of the present disclosure.
Figure 5B:
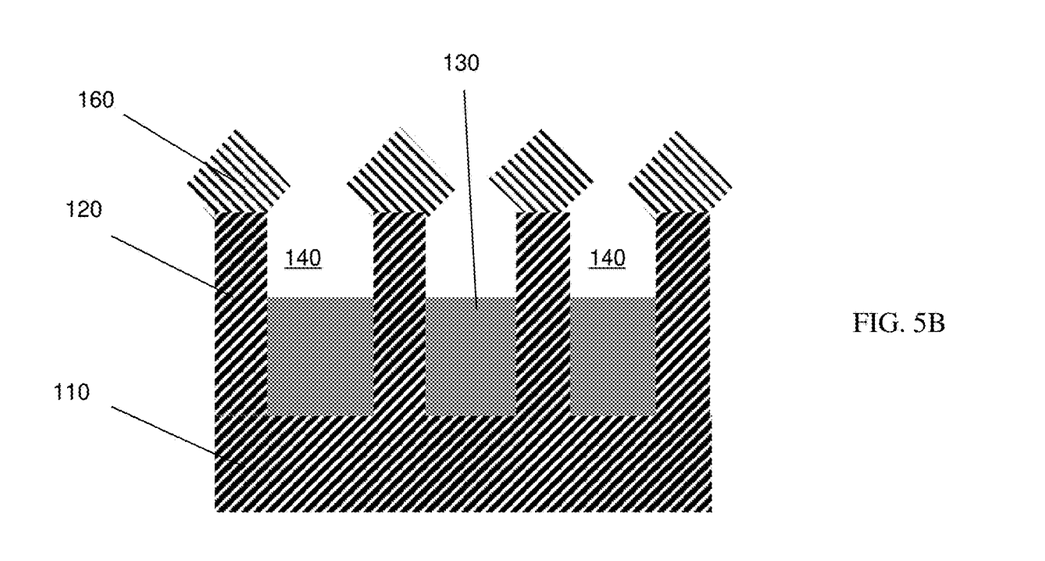

FIG. 5A depicts a top view of the structure 100 with source and drain regions; whereas, FIG. 5B depict the structure 100 along a line Y-Y of FIG. 5A. Specifically, FIGS. 5A and 5B show source and drain regions (S/D) regions 160 formed on the fin structures 120 at sides of the dummy gate structure 150 using, e.g., any conventional method. In this example, the S/D regions 160 can be raised S/D regions 160 formed by a doped epitaxial growth process on the surfaces of the fin structures 120. As illustrated in FIG. 5B, the recessed STI regions 130 are below a surface of source and drain regions 160 on the dummy fin structures 120a. Specifically, the recessed STI regions 130 are below a bottom surface of the source and drain regions 160 on the dummy fin structures 120a.

Figure 6A:
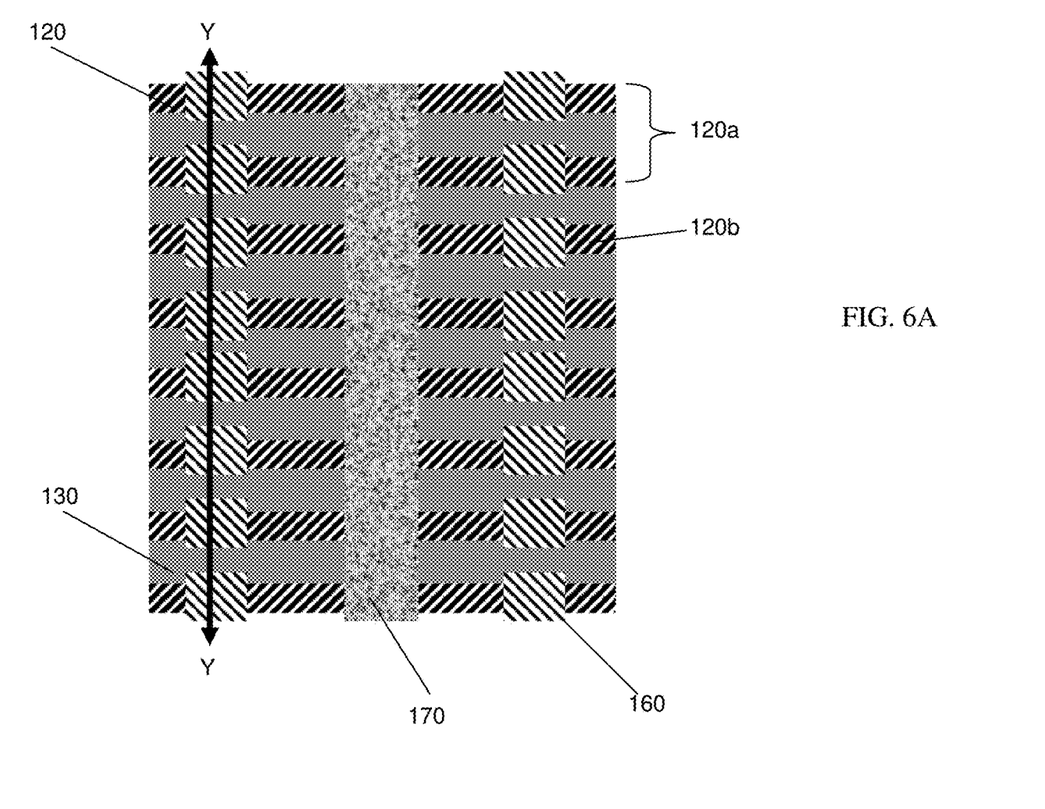
FIGS. 6A and 6B show a replacement gate structure, amongst other features, and respective fabrication processes in accordance with aspects of the present disclosure.
Figure 6B:
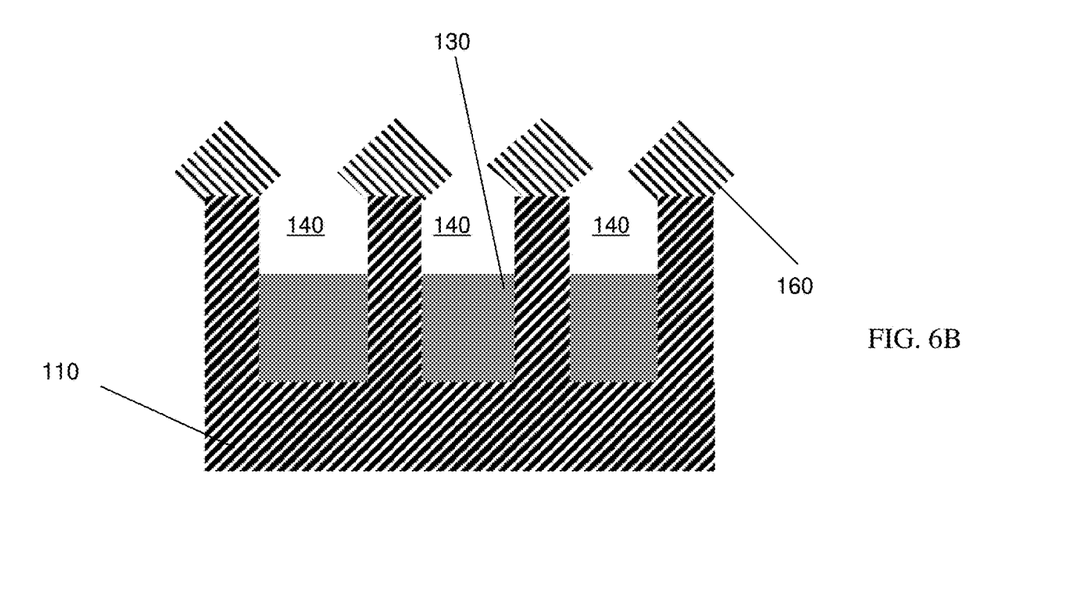

FIG. 6A depicts a top view of the structure 100 with a replacement gate structure 170; whereas, FIG. 6B depicts the structure 100 along a line Y-Y of FIG. 6A. Specifically, FIGS. 6A and 6B illustrate removal of the dummy gate structure 150 and formation of the replacement gate structure 170, along with the dummy fin structures 120a and the single active fin structure 120b. In embodiments, the dummy gate material of the dummy gate structure 150, e.g., poly material, can be removed by a maskless etching process, e.g., a wet etch or dry etch process, due to its selectivity with respect to the semiconductor material of the substrate 110. In this way, the fin structure, i.e., single active fin structure 120b, in the active region includes an active gate structure.

The gate metal can be composed of any suitable conductive material be deposited between sidewall spacers. For example, the gate material can be different workfunction materials. Examples of the workfunction materials for a p-channel FET include Ti, TiAlC, Al, TiAl, TaN, TaAlC, TiN, TiC and Co. In one embodiment, TiN is used for a p-channel FET. Examples of the workfunction materials for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. The workfunction materials may be formed by chemical vapor deposition (CVD), physical vapor deposition (PVD) including sputtering, atomic layer deposition (ALD) or other suitable method. In embodiments, prior to the gate metal deposition, a gate dielectric material can be deposited by an atomic layer deposition (ALD) process, for example. The gate dielectric material can be a high-k dielectric, e.g., $HF_2O_2$. Gate materials are deposited over the gate dielectric.

Figure 7A:
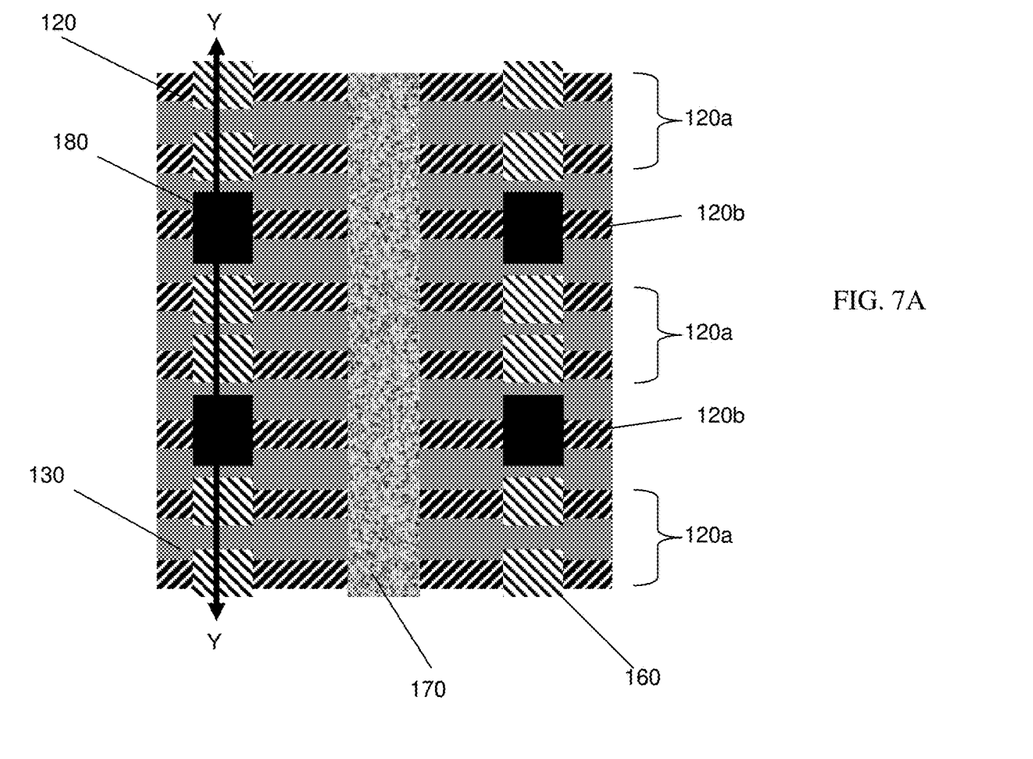
FIGS. 7A and 7B show source and drain contacts, amongst other features, and respective fabrication processes in accordance with aspects of the present disclosure.
Figure 7B:
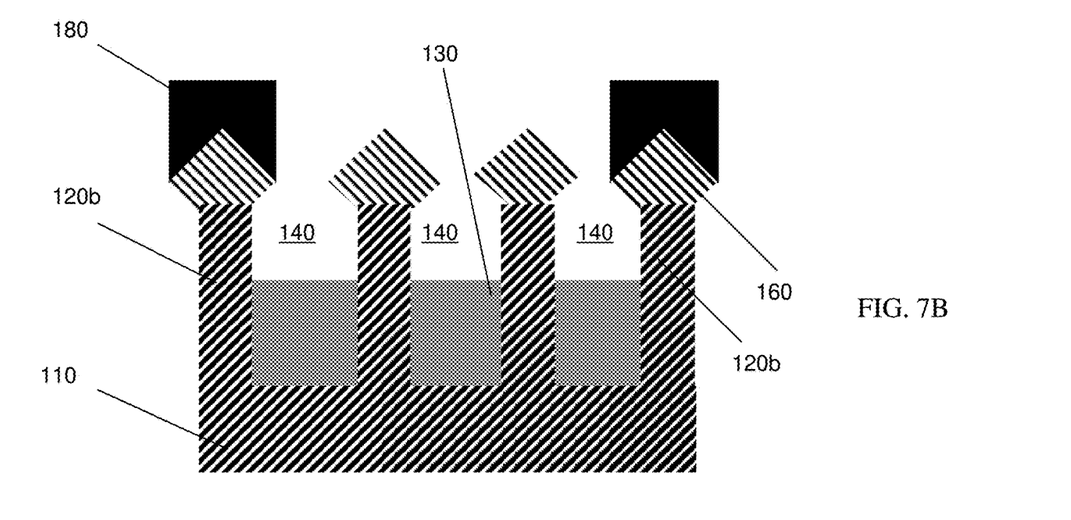

FIG. 7A depicts a top view of the structure 100 with source/drain contacts; whereas, FIG. 7B depicts the structure 100 along a line Y-Y of FIG. 7A. Specifically, FIGS. 7A and 7B illustrate the formation of trench silicide (TS) structures 180 on the single active fin structure 120b, while the TS structures 180 are not formed over dummy fin structures 120a. In this way, the contacts (TS structures 180) land only on the active single fin structure 120b.

Compared to known devices, the TS structures 180 of the present disclosure are smaller in overall size. Specifically, known devices have the dummy fin structures 120a removed, thereby providing greater space and direction for the TS structure formation. In comparison, the structures described herein have the TS structures 180 limited by the dummy fin structures 120a, which are not removed. In embodiments, the S/D regions 160 of dummy fin structures 120a are covered by a masking material, while the S/D regions 160 of the single active fin structure 120b is left exposed.

A silicide liner is deposited over the S/D regions 160 of the single active fin structure 120b and then subjected to a silicide process. The silicide liner can be deposited using physical vapor deposition (PVD) or CVD processes. In embodiments, the silicide liner can be Ti, Ni, NiPt and Co, amongst other examples. As should be understood by those of skill in the art, the silicide process begins with deposition of a thin transition metal layer, e.g., nickel, cobalt or titanium, over fully formed and patterned semiconductor devices (e.g., source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Following the silicide process, a metal material is deposited on the silicide liner, thereby forming the TS structures 180. In embodiments, the metal material can be composed of cobalt (Co) or tungsten (W) or Ruthenium (Ru), for example. In further embodiments, a thin metal liner material can be deposited before deposition metal of the metal material, e.g. TiN, TaN. The deposition of the metal material is followed by a CMP polishing process.

Figure 8:
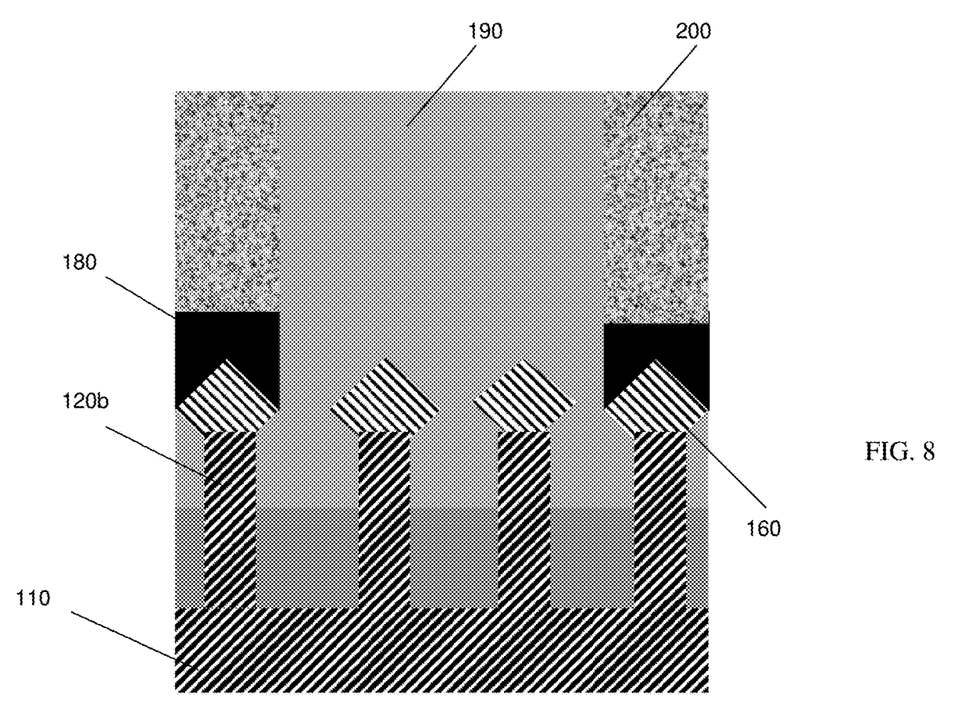
FIG. 8 shows metallization features, amongst other features, and respective fabrication processes in accordance with aspects of the present disclosure.

FIG. 8 illustrates the source and drain (S/D) contacts 200. In this way, the present disclosure provides for a structure which includes a fin structure (single active fin structure 120b) in an active region of a device (structure 100), and a plurality of fin structures (dummy fin structures 120a) in inactive regions of the device and on opposing sides of the fin structure in the active region. Further, source and drain regions 160 on the fin structures 120a, 120b in both the active region and the inactive regions. Additionally, recessed shallow trench isolation (STI) regions 130 are between fin structures 120a, 120b in both the active region and the inactive regions, with contacts 200 formed on the source and drain regions 160 in the active region with a spacing of at least two fin structures (dummy fin structures 120a).

In embodiments, an interlevel dielectric material (ILD) 190, e.g., oxide) is deposited over the TS structures 180. The ILD 190 can be comprised of any suitable dielectric material, e.g., oxide, deposited by a CVD process. The ILD layer 190 is patterned using conventional lithography and etching processes to form one or more trenches in the ILD 190, exposing the TS structures 180. A metal material is deposited within the trenches to form the S/D contacts 200. As illustrated in FIG. 8, the recessed STI regions 130 are below a bottom surface of the contacts 200. Further, the contacts 200 are aligned with respect to a midpoint between at least two fin structures, i.e., dummy fin structures 120a, over the non-device regions. Additionally, the contacts 200 land only on the fin structures, i.e., single active fin structure 120b, which are in the active region.

In embodiments, the metal material can be deposited by CVD processes, and can be any suitable conductive material. For example, the metal material can be tungsten (W), cobalt (Co) or copper (Cu), amongst other examples. The deposition of the metal material is followed by a CMP process. In this way, the structures and processes described herein provide for a structure having an active single fin structure 120b, and a plurality of dummy fin structures 120a on opposing sides of the active single fin structure 120b. Further, source and drain regions 160 formed on the active single fin structure 120b and the dummy fin structures 120a, and recessed shallow trench isolation (STI) regions 130 are between the dummy fin structures 120a and the active single fin structure 120b and below a surface of the dummy fin structures 120a. Additionally, contacts, i.e., TS structures 180, are formed on the source and drain regions 160 of the active single fin structure 120b with a spacing of at least two dummy fin structures 120a on opposing sides of the contacts.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    an active fin structure;
    a first plurality of dummy fin structures being directly adjacent one side of the active fin structure;
    a second plurality of dummy fin structures being directly adjacent an opposing side of the active fin structure;
    a space between the active fin structure and the first and second plurality of dummy fin structures, the space being devoid of additional active fin structures;
    source and drain regions formed on the active single fin structure, the first plurality of dummy fin structures and the second plurality of dummy fin structures; and
    contacts on the source and drain regions of the active single fin structure with a spacing of at least two fin structures.

2. The structure of claim 1, wherein the first and second plurality of dummy fin structures are over a non-device region, and the active single fin structure is over a device region.

3. The structure of claim 1, further comprising:
    recessed shallow trench isolation (STI) regions between the first and second plurality of dummy fin structures and the active single fin structure and below a surface of the first and second plurality of dummy fin structures; and
    the contacts on the source and drain regions of the active single fin structure comprise a spacing of the first plurality of dummy fin structures on one side of the contacts and the second plurality of dummy fin structures on an opposing side of the contacts.

4. The structure of claim 3, wherein the recessed STI regions are below a bottom surface of the source and drain regions on the first and second plurality of dummy fin structures.

5. The structure of claim 3, wherein the recessed STI regions are composed of an oxide, the active fin structure is over a device region, the first and second plurality of dummy fin structures are over a non-device region, the recessed STI regions are below a bottom surface of the source and drain regions on the first and second plurality of dummy fin structures, and the contacts land only on the active fin structure.

6. The structure of claim 3, wherein the contacts land only on the active fin structure.

7. The structure of claim 3, wherein the contacts land only on the active fin structure.

8. The structure of claim 7, further comprising a trench silicide structure over the source and drain regions of the active single fin structure.

9. The structure of claim 8, further comprising an interlevel dielectric material over the trench silicide structure.

10. The structure of claim 1, wherein the first and second plurality of dummy fin structures are separated from one another by at least 40 nm.

11. A structure, comprising:
    a fin structure in an active region of a device;
    a plurality of fin structures in inactive regions of the device and located directly adjacent the fin structure in the active region on opposing sides of the fin structure in the active region;
    source and drain regions on the fin structures in both the active region and the inactive regions; and
    contacts formed on the source and drain regions in the active region with a spacing of at least two fin structures.

12. The structure of claim 11, further comprising recessed shallow trench isolation (STI) regions between the fin structures in both the active region and the inactive regions.

13. The structure of claim 12, wherein the recessed STI regions are below a bottom surface of the contacts.

14. The structure of claim 11, wherein the recessed STI regions are below a surface of the fin structure in the active region.

15. The structure of claim 11, wherein the inactive regions are non-device regions.

16. The structure of claim 15, wherein the contacts are aligned with respect to a midpoint between at least two fin structures over the non-device regions.

17. The structure of claim 16, wherein the contacts land only on the fin structures which are in the active region.

18. The structure of claim 17, wherein the fin structure in the active region is a single fin structure surrounded by dummy fin structures.

19. The structure of claim 18, wherein the fin structure in the active region includes an active gate structure.

20. The structure of claim 11, wherein the fin structure in the active region and the fin structures in the inactive regions are composed of a same material.

* * * * *